United States Patent
Ibrahim et al.

(10) Patent No.: US 10,554,458 B2
(45) Date of Patent: Feb. 4, 2020

(54) LOW-POWER FREQUENCY-SHIFT KEYING (FSK) WIRELESS TRANSMITTERS

(71) Applicant: NORTHEASTERN UNIVERSITY, Boston, MA (US)

(72) Inventors: Mahmoud Ayman Ahmed Ibrahim, Boston, MA (US); Marvin Onabajo, Jamaica Plain, MA (US)

(73) Assignee: NORTHEASTERN UNIVERSITY, Boston, MA (US)

( * ) Notice: Subject to any disclaimer, the term of this patent is extended or adjusted under 35 U.S.C. 154(b) by 0 days.

(21) Appl. No.: 15/945,452

(22) Filed: Apr. 4, 2018

(65) Prior Publication Data

US 2018/0287839 A1    Oct. 4, 2018

Related U.S. Application Data

(60) Provisional application No. 62/481,183, filed on Apr. 4, 2017.

(51) Int. Cl.
| | |
|---|---|
| H04L 27/00 | (2006.01) |
| H04L 27/12 | (2006.01) |
| H03K 5/00 | (2006.01) |
| H04B 1/04 | (2006.01) |
| H03L 7/099 | (2006.01) |
| H03L 7/16 | (2006.01) |
| H03C 3/09 | (2006.01) |
| H03H 7/38 | (2006.01) |

(52) U.S. Cl.
CPC .............. *H04L 27/12* (2013.01); *H03C 3/09* (2013.01); *H03K 5/00006* (2013.01); *H03L 7/0992* (2013.01); *H03L 7/16* (2013.01); *H04B 1/04* (2013.01); *H03H 7/38* (2013.01)

(58) Field of Classification Search
CPC ......... H04L 27/12; H03L 7/0992; H04B 1/04; H03K 5/00006; H03H 7/38
See application file for complete search history.

(56) References Cited

U.S. PATENT DOCUMENTS

| | | | | |
|---|---|---|---|---|
| 6,265,948 | B1 * | 7/2001 | Stevenson | H04L 27/12 332/101 |
| 6,295,466 | B1 * | 9/2001 | Ishikawa | A61B 5/0006 600/377 |
| 7,978,789 | B2 * | 7/2011 | Baker | H04L 27/12 375/303 |
| 2008/0317260 | A1 * | 12/2008 | Short | G10L 21/02 381/92 |
| 2013/0295843 | A1 * | 11/2013 | Tian | H04B 5/00 455/41.1 |
| 2017/0048680 | A1 * | 2/2017 | Chuang | H04W 76/10 |
| 2018/0288717 | A1 * | 10/2018 | Shellhammer | A61B 5/0024 |

* cited by examiner

*Primary Examiner* — Dhaval V Patel

(57) ABSTRACT

Techniques and architectures for providing FSK signal modulation using mixing for the generation of the two output frequencies are described. In an embodiment, a frequency-shift keying (FSK) transmitter may be operative to provide transmission of wireless signals. The FSK transmitter may include a high-frequency generator to generate at least one high-frequency wave signal based on a fixed frequency signal, a low-frequency generator to generate at least one low-frequency wave signal based on the fixed frequency signal, and at least one mixer to mix the at least one high-frequency wave signal and the at least one low-frequency wave signal to generate a logic signal, the logic signal comprising one of a logic 0 signal or a logic 1 signal based on digital input data.

18 Claims, 13 Drawing Sheets

| Parameter | 1010 | 1011 | 1012 | 1013 | 1014 | 1015 | 1016 |
|---|---|---|---|---|---|---|---|
| Power (µWatt) | <140 *** | 350 | 350 | 160 | 90 | 332.6 | 4060/4080 |
| Data Rate (Mb/s) | 1 (max. 10) | 20 | 0.12 | 1 | 0.2 | 2 | 0.55/1 |
| Transmit Power (dBm) | -20 | -15 | N/A | -17 | -17 | N/A | -13 |
| Supply Voltage (V) | 0.6 (analog) 1.2 (digital) | 0.8, and 0.2* | N/A | 0.6, and 1 | 1 | 1, and 0.6** | 1 |
| Process | 0.13 µm CMOS | 0.18 µm CMOS | 90 nm CMOS | 90 nm CMOS | 0.13 µm CMOS | 90 nm CMOS | 0.13 µm CMOS |
| Modulation | BFSK | BPSK | MSK | OOK | BFSK | BFSK | BFSK/QPSK |
| Carrier Generator | ADFLL | injection-locked | DCO | injection-locked | injection-locked | ADFLL | injection-locked |
| FoM (nJ/bit) | <0.14 (min. 0.014) | 0.0149 | 2.9 | 0.16 | 0.45 | 0.1663 | 7.42/0.37 |

* PA supply.  DCO supply. * Simulated sinusoidal signal generator (19.6 µW), combined analog MUX, $G_m$-stage, and summer (54 µW), and power amplifier (36 µW). Estimated: 30 µW for FLL and divider.

[1011] Y.-L. Tsai, C.-Y. Lin, B.-C. Wang, and T.-H. Lin, "A 330-µW 400-MHz BPSK transmitter in 0.18-µm CMOS for biomedical applications," IEEE Trans. on Circuits and Systems II: Express Briefs, vol. 63, no. 5, pp. 448-452, May 2016.
[1012] J. L. Bohorquez, A. P. Chandrakasan and J. L. Dawson, "A 350 µW CMOS MSK transmitter and 400 µW OOK super-regenerative receiver for medical implant communications," IEEE J. Solid-State Circuits, vol. 44, no. 4, pp. 1248-1259. April 2009.
[1013] C. Ma, C. Hu, J. Cheng, L. Xia and P. Y. Chiang, "A near-threshold, 0.16 nJ/b OOK-transmitter with 0.18 nJ/b noise-cancelling super-regenerative receiver for the medical implant communications service," in IEEE Trans. on Biomedical Circuits and Systems, vol. 7, no. 6, pp. 841-850, Dec. 2013.
[1014] J. Pandey and B. P. Otis, "A Sub-100 µW MICS/ISM band transmitter based on injection-locking and frequency multiplication," IEEE J. Solid-State Circuits, vol. 46, no. 5, pp. 1049-1058, May 2011.
[1015] T. V. Cao, C. Maier, D. Wisland, T. S. Lande and G. Cauwenberghs, "BFSK MICS direct-DCO transmitter with adaptive background frequency regulation," in Proc. of the European Solid-State Circuits Conf. (ESSCIRC), 2012, pp. 305-308.
[1016] K. H. Teng and C. H. Heng, "A 370-pJ/b multichannel BFSK/QPSK transmitter using injection-locked fractional-N synthesizer for wireless biotelemetry devices," IEEE J. Solid-State Circuits, vol. 52, no. 3, pp. 867-880, March 2017.

*FIG. 10*

LOW-POWER FREQUENCY-SHIFT KEYING (FSK) WIRELESS TRANSMITTERS

CROSS-REFERENCE TO RELATED APPLICATIONS

This application claims priority to U.S. Provisional Patent Application Ser. No. 62/481,183, filed on Apr. 4, 2017, entitled "LOW-POWER TRANSMITTER ARCHITECTURE FOR WIRELESS COMMUNICATION WITH BINARY FREQUENCY SHIFT KEYING USING FREQUENCIES IN THE MEDICAL IMPLANT COMMUNICATION SERVICE BAND," the content of which is incorporated herein by reference.

STATEMENT OF GOVERNMENTAL SUPPORT

This invention was made with government support under Grant No. 1451213, awarded by the National Science Foundation. The Government has certain rights in the invention.

TECHNICAL FIELD

Embodiments herein generally relate to wireless transmitters, and more particularly, to architectures and techniques for low-power radio frequency transmitters.

BACKGROUND

Power requirements are a substantial limitation of wireless communication devices, such as Internet of Things (IoT) devices. In general, conventional wireless communication devices have been powered using two main approaches: using a battery that requires replacement, or energy harvesting from an external source. A problem arises when such devices have to operate continuously in order to send data, for example, to implement alerts, monitoring, reporting (for example, reporting abnormal conditions), and/or the like. Under such operational conditions, conventional wireless communication devices are not able to meet power demands without sacrificing design characteristics, such as performance, size, weight, and/or cost.

BRIEF DESCRIPTION OF THE DRAWINGS

FIG. 10 depicts a table that shows a comparison of the architectures according to some embodiments with conventional architectures.

DETAILED DESCRIPTION

Figure 1:
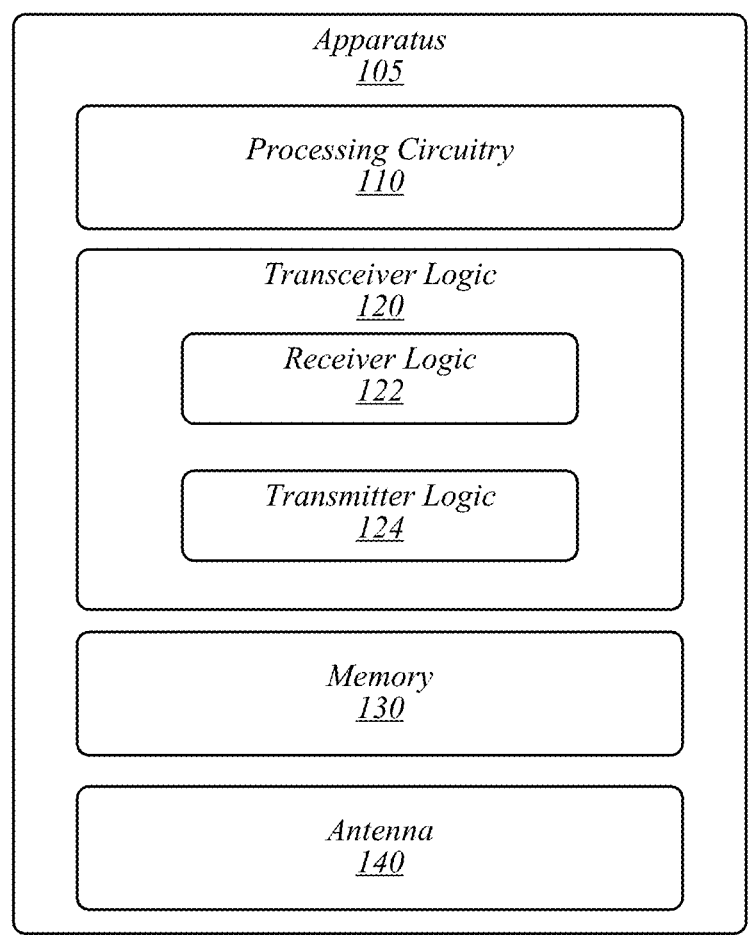
FIG. 1 illustrates an embodiment of a first operating environment.

Various embodiments may generally be directed toward wireless transmitters for portable electronic devices. In some embodiments, the wireless transmitters may include circuitry operative to generate radio communications using a frequency-shift keying (FSK) scheme. In general, frequency-shift keying is a frequency modulation scheme in which digital information can be transmitted by discrete changes of a carrier wave frequency. One form of FSK is binary frequency-shift keying (BFSK) where a logical "1" is represented by a first frequency of a carrier wave and a logical "0" is represented by a second frequency of the carrier wave. In various embodiments, the wireless transmitters may use an FSK architecture that utilizes mixing and image rejection techniques to generate the two carrier frequencies for FSK transmission. The FSK architecture according to some embodiments may enable low power consumption for a wide range of data rates by avoiding fast settling time requirements for a frequency-locked loop (FLL) of the FSK architecture. In exemplary embodiments, the FSK architecture may use or may include a binary FSK (BFSK) architecture.

Portable electronic devices may use wireless transmitters configured according to some embodiments to implement wireless communications. For example, a portable electronic device may include a radio chipset having a wireless transceiver operating according to exemplary embodiments to receive, process, and/or transmit digital data. Non-limiting examples of portable electronic devices may include computing devices (for instance, smart phones, tablet computing devices), sensors, actuators, embedded vehicle devices, medical devices, Internet of Things (IoT) devices, and/or the like.

Wireless transmitters may be a primary component for providing the functionality of a portable electronic device. For example, portable wireless medical devices are instrumental for monitoring of vital signs and the treatment of chronic diseases. A wireless transmitter is necessary to wirelessly transmit such information to computing devices with receivers capable of processing such information and facilitating associated services, such as emergency services or diagnostic services. There has generally been two approaches to powering such devices: they can use a battery that requires replacement, or they can be powered by energy harvesting from an external source. A problem arises when the device has to operate continuously in order to send data for monitoring, alerts about abnormal conditions, and/or the like. This has created a need for low-power transmitters that are able to send data at any time while allowing the medical device to operate in an energy-efficient manner. The Federal Communications Commission (FCC) has facilitated the deployment of wireless medical devices by providing frequency bands through the medical implant communication service (MICS) and the medical device radiocommunications service (MedRadio). MedRadio includes a range of frequencies from 401 megahertz (MHz) to 457 MHz, as listed in Table 1. This range has the benefit of low power consumption due to relatively low transmission frequencies. Conventional systems have used two main approaches to generate the output frequencies for ultra-low power transmitters: injection-locked oscillators, and all-digital frequency-locked loops (ADFLL). The modulations used in these transceivers are simple such as BFSK, binary phase shift keying (BPSK), on/off keying (OOK), minimum shift keying (MSK), and quadrature phase shift keying (QPSK). In general, data rates have ranged from about 120 Kbps up to about 20 Mbps.

TABLE 1

MICS Bands

| Start (MHz) | End (MHz) | Channel Width (MHz) |
|---|---|---|
| 401 | 401.85 | 0.1 |
| 401.85 | 402 | 0.15 |
| 402 | 405 | 0.3 |
| 405 | 406 | 0.1 |
| 413 | 419 | 6 |
| 426 | 432 | 6 |
| 438 | 444 | 6 |
| 451 | 457 | 6 |

One of the most power-hungry blocks in a FSK transmitter is the FLL, whose power is inversely proportional to its settling time. Reduced settling time is required to achieve higher data rates, which leads to higher power consumption. Exemplary embodiments provide architecture that, among other things, alleviates the need for fast FLL settling time by realizing mixing and image rejection techniques to quickly switch between two frequencies without changing the frequencies of the frequency generators. Accordingly, some embodiments provide a wireless transmitter architecture with a low-power FLL. Since the maximum data rate of BFSK is directly proportional to the switching speed between the two frequencies, the data rate of a wireless transmitter architecture according to some embodiments may be associated with the channel bandwidth and may not be or may not be entirely dependant on the setting time of the FLL.

In this manner, a wireless transmitter architecture according to some embodiments may achieve low overall transmitter power consumption. For example, a wireless transmitter architecture according to some embodiments (for instance, a wireless transmitter architecture designed in a 130 nm CMOS structure operating in the 401-457 MHz range) may achieve data rates up to 10 Mbps, a power consumption of 140 µW or lower from a 0.6 V supply, and an energy efficiency of 14 pJ/b while delivering −20 dBm of output power.

In this description, numerous specific details, such as component and system configurations, may be set forth in order to provide a more thorough understanding of the present invention. It will be appreciated, however, by one skilled in the art, that the invention may be practiced without such specific details. Additionally, some well-known structures, circuits, and other features have not been shown in detail, to avoid unnecessarily obscuring the present invention.

In the following description, references to "one embodiment," "an embodiment," "example embodiment," "various embodiments," etc., indicate that the embodiment(s) of the invention so described may include particular features, structures, or characteristics, but more than one embodiment may and not every embodiment necessarily does include the particular features, structures, or characteristics. Further, some embodiments may have some, all, or none of the features described for other embodiments.

As used in this description and the claims and unless otherwise specified, the use of the ordinal adjectives "first," "second," "third," etc. to describe an element merely indicate that a particular instance of an element or different instances of like elements are being referred to, and is not intended to imply that the elements so described must be in a particular sequence, either temporally, spatially, in ranking, or in any other manner.

FIG. 1 illustrates an example of an operating environment 100 that may be representative of some embodiments. As shown in FIG. 1, operating environment 100 may include an apparatus 105 having processing circuitry 110 and transceiver logic 120. Apparatus 105 may include various logic devices operative to provide wireless communication, such as a portable computing device, sensor, IoT device, medical device, and/or the like. Embodiments are not limited in this context.

Processing circuitry 110 may be any type of analog circuit or digital processor capable of executing programs, such as a microprocessor, digital signal processor, microcontroller, and/or the like. Processing circuitry 110 may include analog components, programmable logic or hard coded logic for execution in embodiments. Although FIG. 1 shows only one such processing circuitry 110, apparatus 105 may include a plurality of processing circuitries 110. Additionally, processing circuitry 110 may include multiple cores, support for multiple threads, and/or the like.

Memory 130 may comprise random access memory (RAM), read only memory (ROM), flash memory, any other type of volatile memory devices or non-volatile memory devices, or combination of the above devices, or any other type of machine medium readable by processing circuitry 110 in various embodiments. Memory 130 may store instructions and/or data for performing program execution and other method embodiments.

Transceiver logic 120 may be operative as a wireless communication transceiver to receive digital signals via receiver logic 122 and to transmit digital signals via transmitter logic 124. Apparatus may include at least one wireless antenna 140 to receive incoming wireless signals and/or to radiate outgoing wireless signals. As used in this application, the terms "logic," "component," "layer," "system," "circuitry," "decoder," "encoder," and/or "module" are intended to refer to a computer-related or analog circuit-related entity, either hardware, a combination of hardware and software, software, or software in execution, examples of which are provided by the exemplary computing architecture 1400. For example, a logic, circuitry, or a layer may be and/or may include, but are not limited to, a process running on a processor, a processor, multiple storage drives, an object, an executable, a thread of execution, a program, a computer, hardware circuitry, integrated circuits, a controller, application specific integrated circuits (ASIC), programmable logic devices (PLD), digital signal processors (DSP), field programmable gate array (FPGA), a system-on-a-chip (SoC), memory units, logic gates, registers, semiconductor device, chips, microchips, chip sets, software components, programs, applications, firmware, software modules, computer code, combinations of any of the foregoing, and/or the like In an exemplary embodiment, transmitter logic 124 may include a 401-457 MHz BFSK MICS transmitter (TX) architecture with built-in frequency translation and image rejection for the generation of the two data-dependent output frequencies. Such an architecture may not be required to rely on a fast frequency-locked loop for the switching of the output frequency during data transmissions, which leads to low power consumption even with relatively high data rate. In some embodiments, transmitter logic 124 may achieve BFSK data rates up to about 10 Mbps with an estimated power consumption up to about 140 µW. In various embodiments, transmitter logic 124 and processing circuitry 130 may be designed in 130 nm CMOS technology, and may achieve an energy efficiency of about 14 pJ/bit (with a maximum data rate of 10 Mbps) while delivering about −20 dBm of output power with an about 50Ω load and modeled package parasitics.

Figure 2:
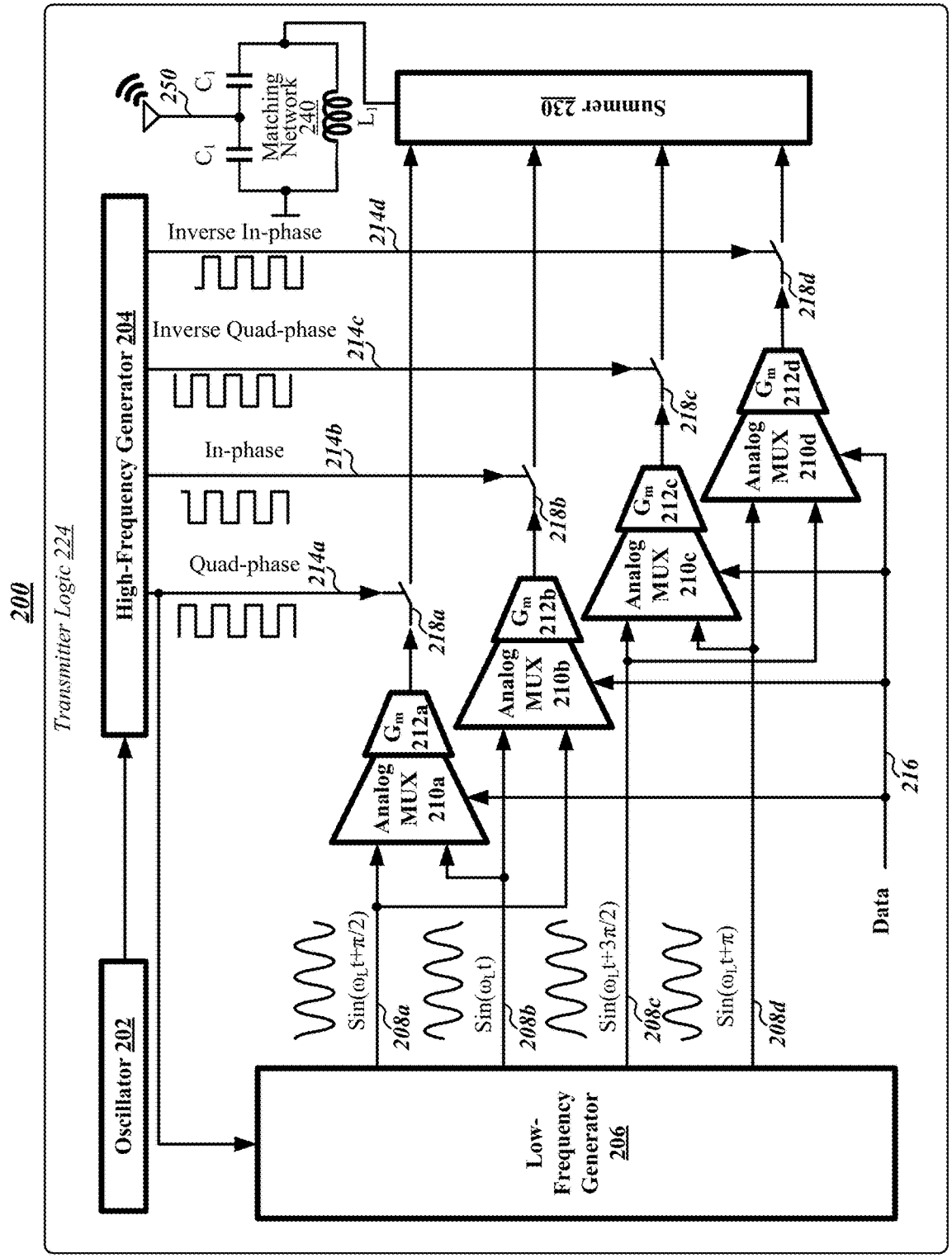
FIG. 2 illustrates an embodiment of a second operating environment.

FIG. 2 illustrates an example of an operating environment 200 that may be representative of some embodiments. As shown in FIG. 2, operating environment 200 depicts a transmitter logic 224, for example, corresponding to transmitter logic 124 of FIG. 1. In various embodiments, transmitter logic 224 may utilize BFSK modulation, which allows reducing power consumption by using mixing for the generation of the two output frequencies according to some embodiments instead of using a high speed FLL to switch between two frequencies as used in conventional systems.

In some embodiments, transmitter logic 224 and/or processing circuitry 130 may include an oscillator 202, such as a crystal oscillator, to provide a fixed frequency signal. In various embodiments, oscillator 202 may be off-chip. In some embodiments, oscillator 202 may provide a frequency in the gigahertz (GHz) to kilohertz (KHz) range. In various embodiments, oscillator 202 may provide a frequency of about 32 KHz. The frequency signal from oscillator 202 may be received by a high-frequency generator 204 for generating the high frequency ($\omega_H$) and/or a low-frequency generator 206 for generating the baseband or low frequency ($\omega_L$). In some embodiments, high-frequency generator 204 may be or may include an ADFLL, and low-frequency generator 206 may be or may include a divider.

High-frequency generator 204 may generate various wave signals 214a-d, including, without limitation, quad-phase wave signals 214a, in-phase wave signals 214b, inverse quad-phase wave signals 214c, and/or inverse in-phase wave signals 214d. Low-frequency generator 206 may generate various wave signals 208a-d, including, without limitation, Sin($\omega_L$tπ/2) 208a, Sin($\omega_L$t) 208b, Sin($\omega_L$t+3π/2) 208c, and/or Sin($\omega_L$t+π) 208d. In various embodiments, wave signals 208a-d may be provided to analog multiplexers 210a-d and/or transconductance stages ($G_m$) 212a-d to be processed with data 216. Wave signals 214a-d and wave signals 208a-d (for instance, after processing via analog multiplexers 210a-d and/or transconductance stages 212a-d) may be provided to a summing 230 stage and a matching network 240 stage before transmission using antenna 250.

Figure 3:
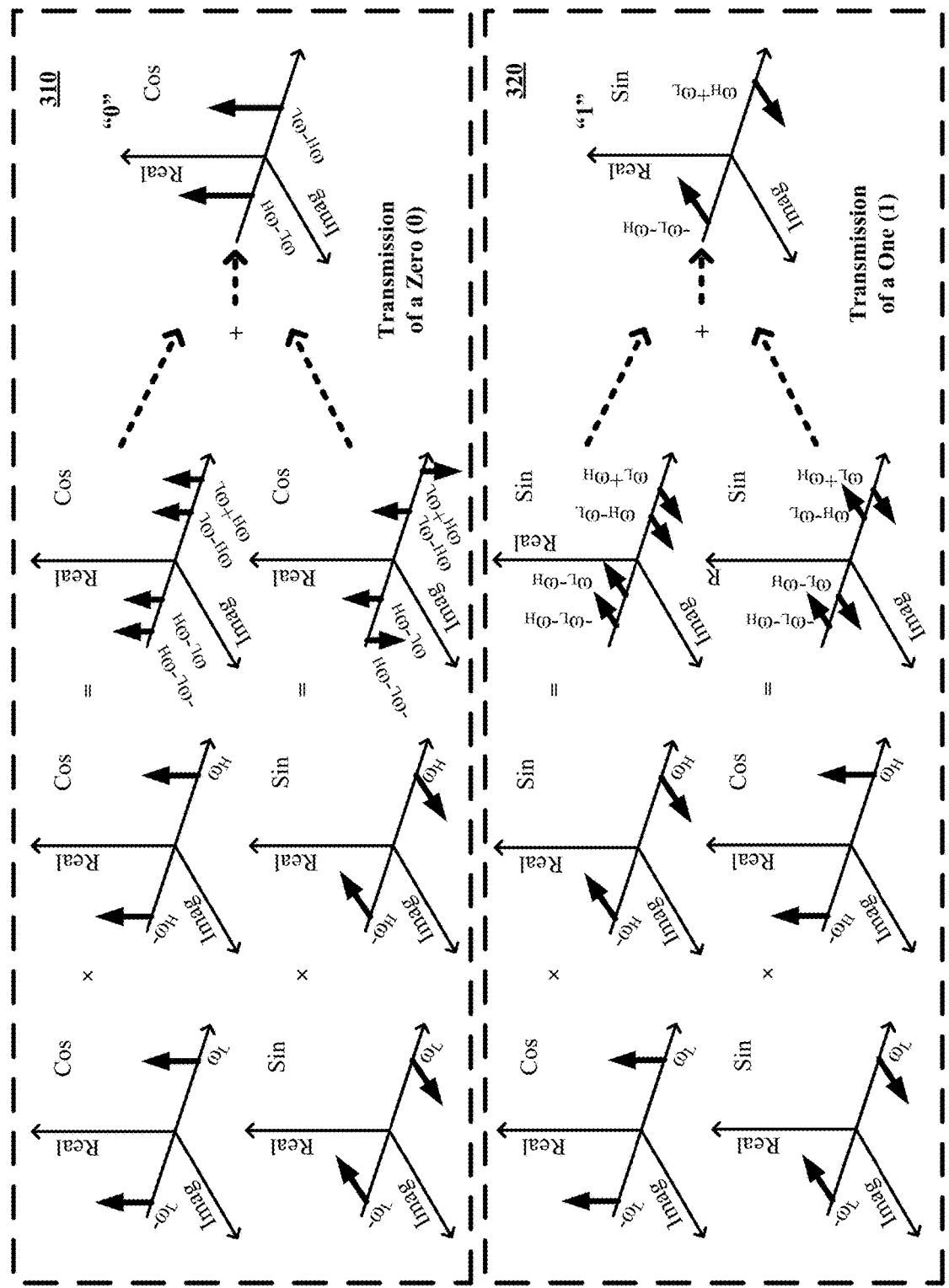
FIG. 3 depicts a transmission frequency generation process according to some embodiments.

FIG. 3 depicts a transmission frequency generation process according to some embodiments using, for example, transmitter logic 224. As shown in FIG. 3, the transmission process for transmission of a zero 310 and transmission of a one 320 may involve the processing of signals with two fundamental frequencies that remain constant throughout the operation. For example, the high frequency ($\omega_H$) for signal transmission can vary according to the utilized channel from 401 MHz to 457 MHz, and the baseband frequency ($\omega_L$), which may equal the bandwidth of the channel divided by two, can vary from 50 KHz to 10 MHz. In general, FIG. 3 graphically illustrates the mixing process within the transmitter logic 224 architecture and processing circuitry of FIG. 2, which may be provided by the following equations (1) and (2), with ideal sinusoids (for instance, representing the fundamental tones of the mixed signals) for simplicity.

To generate the first frequency (which corresponds to "0" data in FIG. 3):

$$V_{out} = \sin(\omega_L \cdot t) \times \sin(\omega_H \cdot t) + \cos(\omega_L \cdot t) \times \cos(\omega_H \cdot t) \quad (1)$$

$$\therefore V_{out} = K \cdot \cos((\omega_H - \omega_L) \cdot t) + \ldots$$

$$\therefore F_{out} = \frac{\omega_H - \omega_L}{2 \cdot \pi} = F_1.$$

To generate the second frequency (which corresponds to "1" data in FIG. 3):

$$V_{out} = \sin(\omega_L \cdot t) \times \cos(\omega_H \cdot t) + \cos(\omega_L \cdot t) \times \sin(\omega_H \cdot t) \quad (2)$$

$$\therefore V_{out} = K \cdot \sin((\omega_H + \omega_L) \cdot t) + \ldots$$

$$\therefore F_{out} = \frac{\omega_H + \omega_L}{2 \cdot \pi} = F_2.$$

Although FIG. 3 depicts the first frequency corresponding to "0" data and the second frequency corresponding to "1" data, embodiments are not so limited, as systems may be implemented in which the first frequency corresponds to "1" data and the second frequency corresponds to "0" data.

In some embodiments, frequency mixing products outside the band of interest may be dropped from equations (1) and (2) since the components may be suppressed by the band-pass matching network. In various embodiments, the constant K in equations (1) and (2) may be the combination of the mathematical expressions as well as the gains in the transconductance stage ($G_m$) 212a-d, summing 230 stage, and matching network 240 depicted in FIG. 2. In some embodiments, each analog multiplexer 210a-d may be or may include PMOS switches, for example, that have negligible impact on the gain during the selection of the low-frequency signals.

In exemplary embodiments, $\omega_H$ may be a rail-to-rail digital signal (for instance, a square wave) generated by an ADFLL, and may be applied to switches for up-conversion of the sinusoid having a frequency of $\omega_L$, the output of the summer stage (for instance, summer stage 230 in FIG. 2) may contain harmonics at multiples of $\omega_H$. These harmonics may suppressed by the filtering in a matching network (for instance, matching network 240 of FIG. 2). In various embodiments, the low-frequency signal at $\omega_L$ may be a sinusoidal-like signal, for example, to avoid harmonics located at frequencies that are separated from $\omega_H$ by multiples of $\omega_L$, which could fall into the passband of a matching network.

Figure 4:
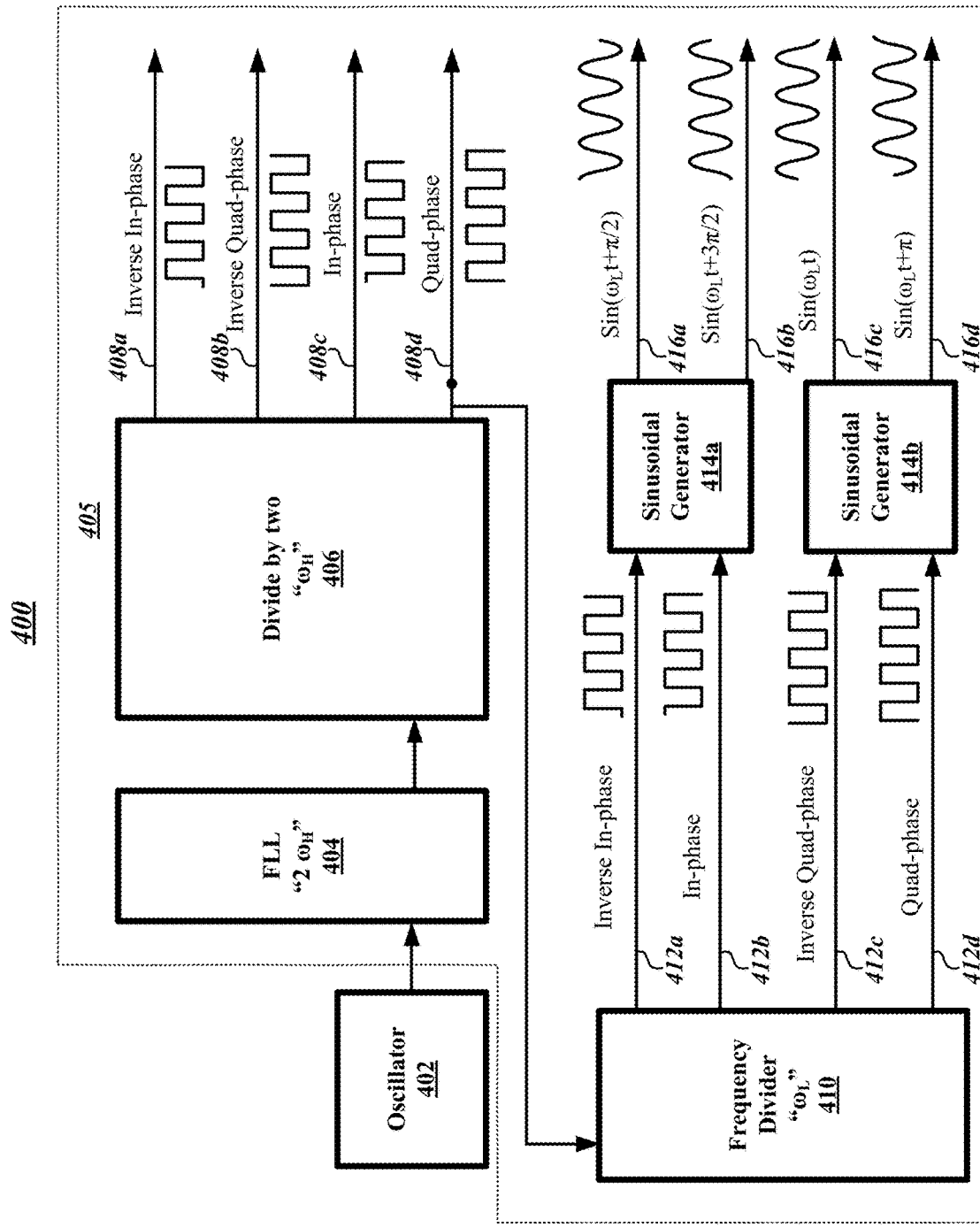
FIG. 4 illustrates an embodiment of a third operating environment.

FIG. 4 illustrates an example of an operating environment 400 that may be representative of some embodiments. In general, FIG. 4 illustrates the signal generation components of a transmission logic according to some embodiments. As shown in FIG. 4, operating environment 400, a transmitter architecture 405 may include an off-chip oscillator 402, for example, with a frequency of 32 KHz, operative to provide a signal to an FLL 404. A divider 406 (for instance, a divide by two divider) may be operative to generate wave signals 408a-d. A frequency divider 410 may be operative to generate wave signals 412a-2. Sinusoidal generator 414a may generate wave signals 416a and 416b from wave signals 412a and 412b, and sinusoidal generator 414b may generate wave signals 416c and 416d from wave signals 412c and 412d.

The transmission logic architecture according to some embodiments does not necessitate variable frequencies during data transmissions. Accordingly, FLL 404 may have a relaxed locking time. In various embodiments, frequency changes may only required when the channel is changed. The FLL frequency produced by FLL 404 may be divided by two by divider 406 to generate the in-phase and quad-phase square waves 408a-d at $\omega_H$. It may also be generated by a separate low-frequency FLL or other frequency generation means. In exemplary embodiments, the signal at $\omega_L$ may be produced by frequency divider 410 (for example, $\omega_H \div 400$) to obtain the in-phase and quad-phase square wave signals 412a-d, from which the sinusoidal waveforms 416a-d are generated. In some embodiments, sinusoidal waveforms 416a-d may have an amplitude of about 50 mV.

Referring to FIG. 2, the low-frequency generator output voltages 416a-d (in FIG. 4) may be fed to transconductors ($G_m$) 212a-d to convert them to currents that are easier to sum at high frequency compared to voltages. In various embodiments, these currents may be up-converted to the transmission band by the switches 218a-d serving as mixers. All currents may then be summed and converted to a voltage that is applied to antenna 250 (for example, at a 50Ω load) by the power amplifier within the summer block 230. Digital data 216 fed to the analog MUXs 210a-d may decide how the tones are mixed to produce ($\omega_H+\omega_L$) as logic "1" or ($\omega_H-\omega_L$) as logic "0."

Figure 5:
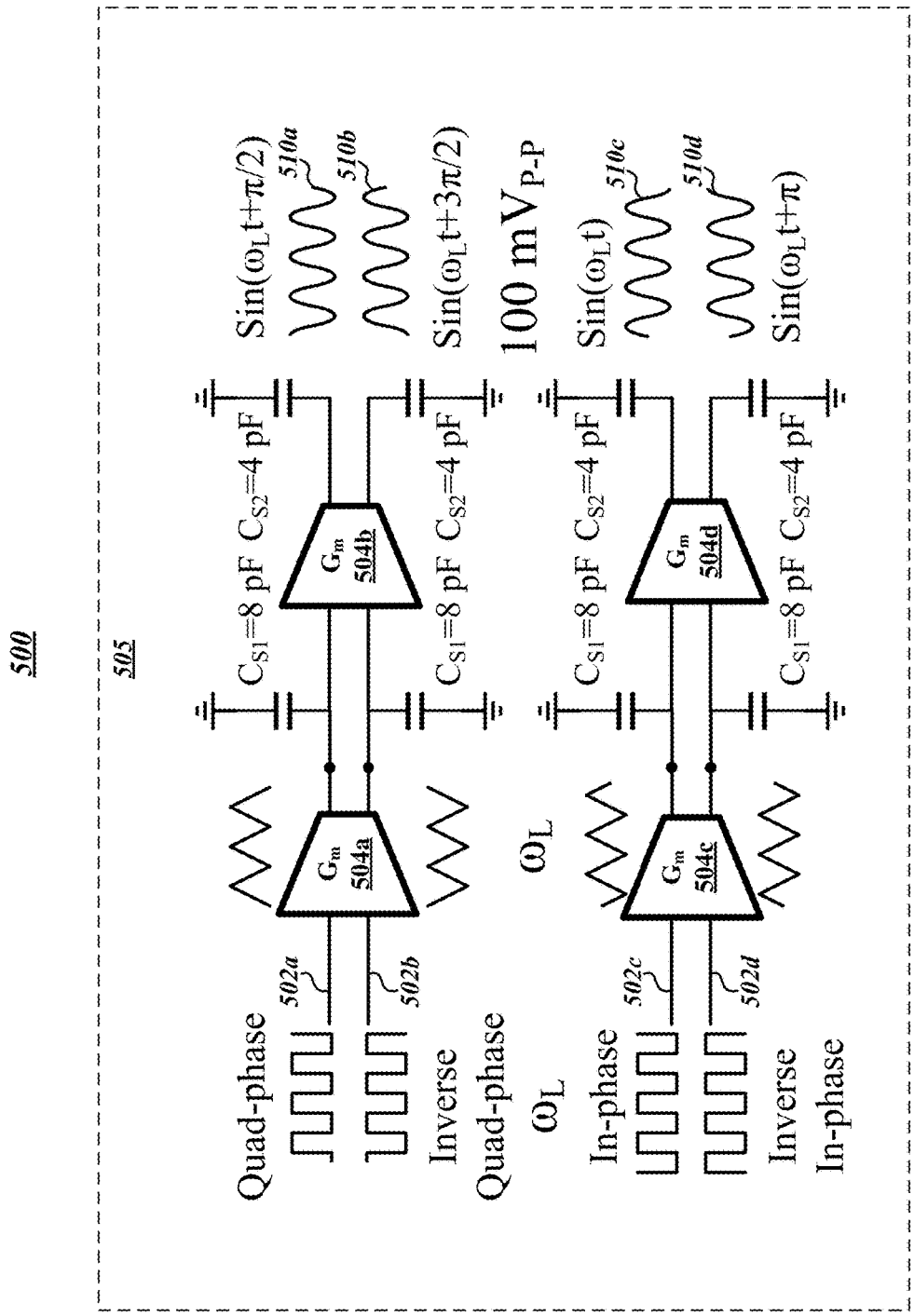
FIG. 5 illustrates an embodiment of a fourth operating environment.

FIG. 5 illustrates an example of an operating environment 500 that may be representative of some embodiments. In general, FIG. 5 illustrates a sinusoidal signal generater 505 according to some embodiments. In some embodiments, sinusoidal signal generator 505 may provide a 50 mV $\sin(\omega_L \cdot t)$ signal with four equally-spaced phases. Sinusoidal signal generator 505 block may be composed of in-phase paths 502c, 502d and quad-phase paths 502a, 502b, each containing two low-power operational transconductance amplifiers (OTAs) 504a-d with capacitors at the outputs. In various embodiments, the OTA configurations may act as or similar to cascaded integrators. The integration of the first stage results in triangular signals and that of the second stage results in a second-order polynomial. This polynomial can be approximated as a sinusoidal signal with harmonics. In some embodiments, a folded cascode OTA design, the same or similar to the OTA configuration depicted in FIG. 5, may provide power consumption of about 4.9 µW from an about 0.6 V supply, such that the sinusoidal signal generator's power is about 19.6 µW. In some embodiments, the OTAs 504a-c may have a low-frequency gain of about 49 dB, a unity-gain frequency of about 1.8 MHz, and a third-order harmonic distortion (HD3) of about −40.9 dB with an about 250 mV$_{P-P}$ sinusoidal input. With digital rail-to-rail inputs 502a-d to the first stage of sinusoidal signal generator 505, the 50 mV sinusoidal outputs 510a-d of the second stage may have a second-order harmonic distortion (HD2) of about −49.4 dB and an HD3 of about −52.7 dB.

Figure 6:
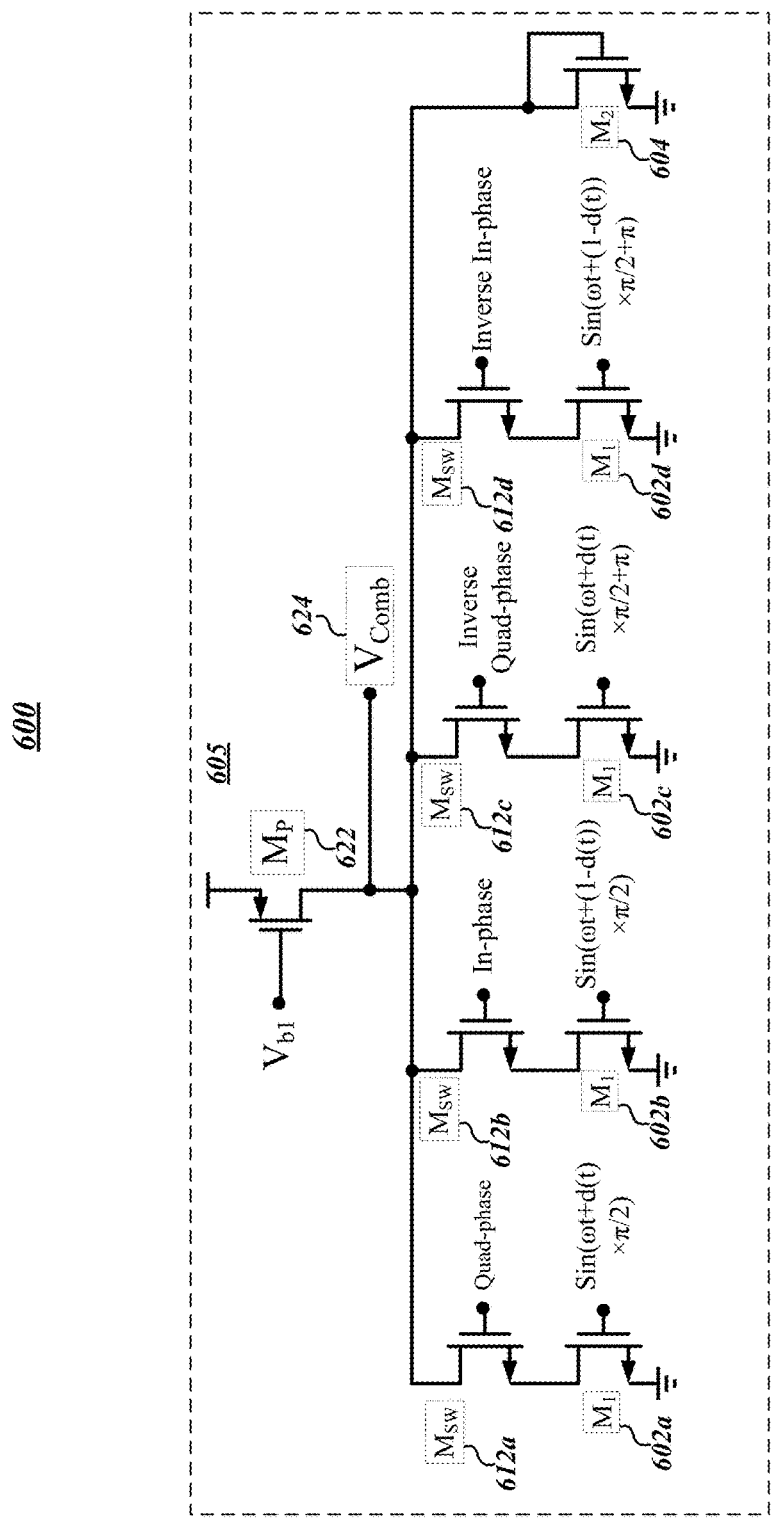
FIG. 6 illustrates an embodiment of a fifth operating environment.

FIG. 6 illustrates an example of an operating environment 600 that may be representative of some embodiments. As shown in FIG. 6, architecture 605 may include a stage of a transmission logic and processing circuitry that converts the sinusoidal signals to currents (for example, the $G_m$-stage 212a-d stage of transmitter logic 224), up-converts them to the transmission band via switching, sums the resulting currents, and then converts the resulting current into a voltage using a diode-connected transistor ($M_2$).

In some embodiments, the $M_1$ transistors 602a-d may operate as the $G_m$-stage. The gates of $M_1$ transistors 602a-d may be AC-coupled to the sinusoidal signal generator with 1 pF capacitors, and the DC gate bias voltage may be provided through 500 KΩ PMOS pseudo-resistors consisting of PMOS transistors, for example, to save area. In some embodiments, the d(t) in the sinusoids may depend on the digital data (for instance, digital data 216) applied to the multiplexers (for instance, analog MUXs 210a-d).

In various embodiments, Transistor $M_P$ 622 may operate as a bias current source. In exemplary embodiments, switches $M_{SW}$ 612a-d may be directly controlled by the digital signal (for example, levels with reduced supply: 0 V and 0.6 V) with a fundamental frequency of $\omega_H$ for the up-conversion process according to some embodiments. Transistor $M_2$ 604 may be biased in the subthreshold region to increase its effective resistance ($\approx 1/g_{m2}$) for enhanced voltage swing at the output $V_{comb}$ 624. In some embodiments, the power consumption of architecture 605 may be about 54 µW from an about 0.6 V supply.

Figure 7:
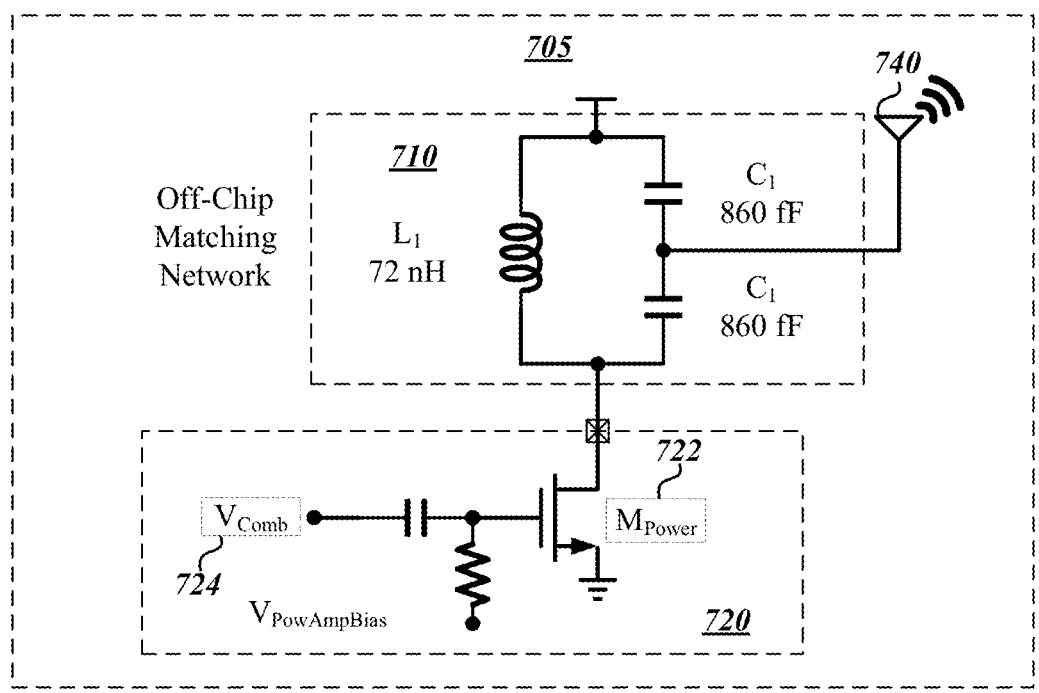
FIG. 7 illustrates an embodiment of a sixth operating environment.

FIG. 7 illustrates an example of an operating environment 700 that may be representative of some embodiments. As shown in FIG. 7, architecture 705 may include a power amplifier 722 for a transmission logic according to various embodiments. The architecture 705 may provide a power amplifier 722 that receives the summed input ($V_{comb}$) 724, and drives antenna 740 (for example, with a 50Ω resistance) using class AB biasing and AC-coupling at its input, where other biasing (with a different amplifier class) may be used. In some embodiments, off-chip matching network component 710 may include values selected to match antenna 740 and transistor $M_{Power}$ 722. In some embodiments, matching network 710 may act as a filter for the higher-order mixing byproducts at multiples of $\omega_H$. In various embodiments, power amplifier 722 of architecture 705 may consume about 36 µW.

Figure 8:
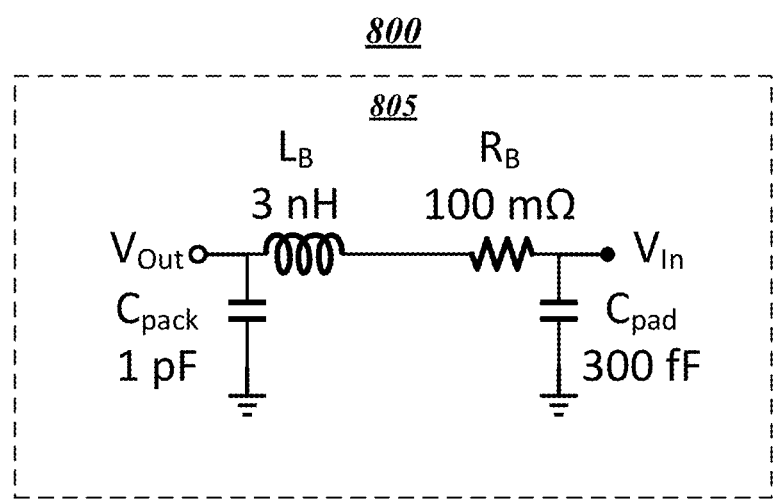
FIG. 8 illustrates an embodiment of a seventh operating environment.

FIG. 8 illustrates an example of an operating environment 800 that may be representative of some embodiments. As shown in FIG. 8, architecture 805 may include a package and pad parasitics unit according to some embodiments. In some embodiments, architecture 805 may operate to handle or otherwise take into consideration the effects of package, bonding wires and pad parasitics for a typical quad-flat no-leads (QFN) package at the output.

Experiments

Experiment 1: System-Level Simulation

Figure 9:
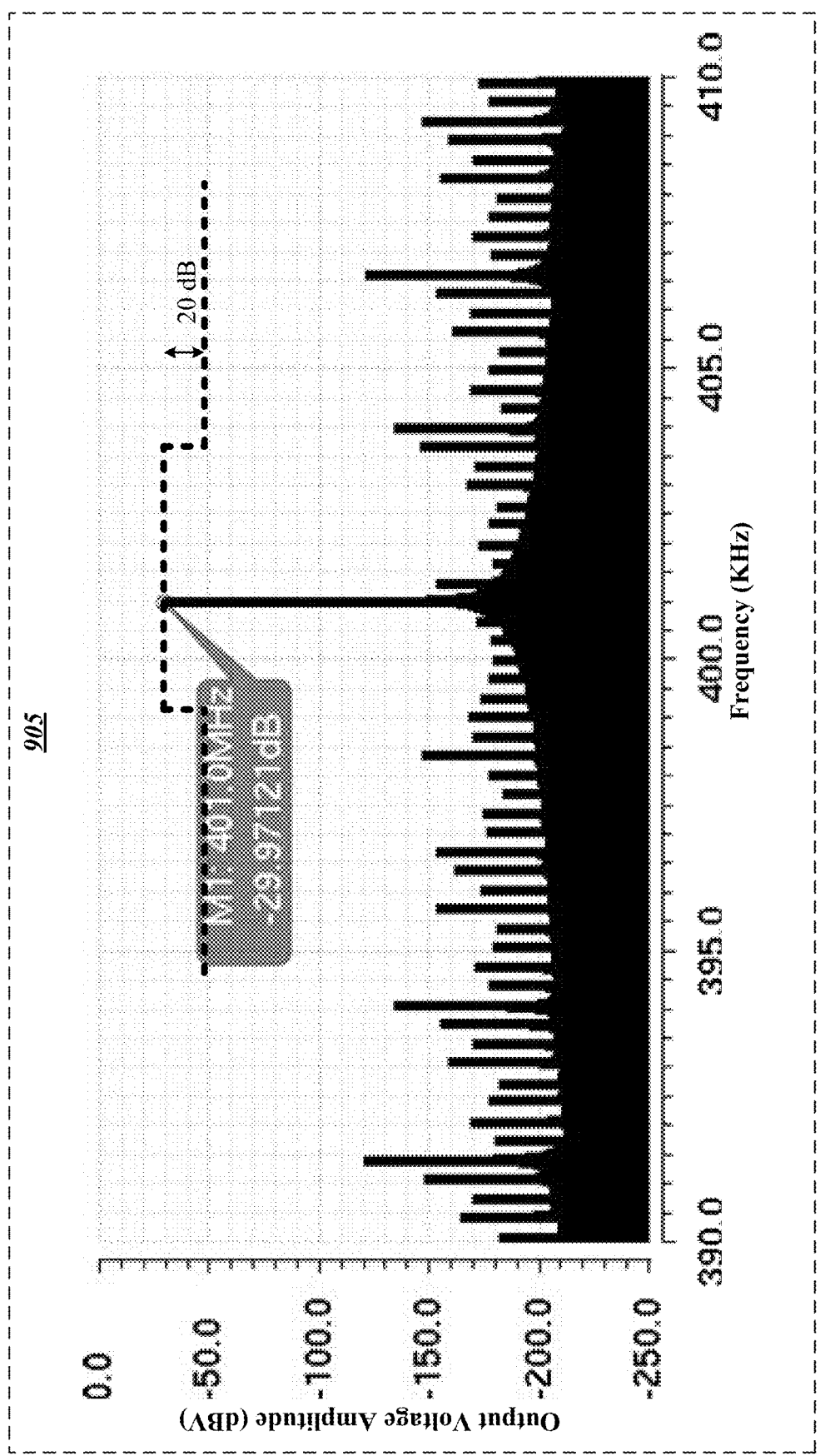
FIG. 9 depicts a graph illustrating the results of the system-level simulation for output voltage amplitude versus frequency.

A system-level simulation was performed using a transmitter configured according to some embodiments using ideal behavioral blocks. FIG. 9 depicts a graph 905 illustrating the results of the system-level simulation for output voltage amplitude versus frequency. More specifically, FIG. 9 shows the output for a transmitter logic configured according to some embodiments (for example, transmitter logic 224) for repetitive transmission of a logic "1" with a 400 MHz ADFLL output and a 1 MHz sinusoid. The output tone is shifted by 1 MHz relative to the frequency of the high-frequency generator output, and resulting undesired harmonics are at least 90 dB below carrier. The results depicted in FIG. 9 indicate that transmitter logic configured according to some embodiments may perform well in compliance with the FCC regulation, which requires the out-of-band harmonics to be at least −20 dB with respect to the transmitted signal at 401 MHz.

Experiment 2: Circuit-Level Simulations

Simulations of the architectures or circuits according to the embodiments depicted in FIGS. 5-8 were performed using ideal $\omega_H$ and $\omega_L$ square waveforms (for example, after the dividers in FIG. 4) in a conventional circuit simulator with foundry-supplied device models for a standard 130 nm CMOS process technology. The effects of package, bonding wires and pad parasitics were taken into consideration by including the architecture in FIG. 8 for a typical QFN package at the output.

Ideal square wave generators (pulse sources) were used for simulations instead of an ADFLL and divider. A well-designed low-power ADFLL can consume 100 μW for an output frequency around 2.4 GHz. Accordingly, for power estimation, a maximum ADFLL and divider power of 30 μW was estimated for a design with a lower output frequency in the 802-914 MHz range (for example, equaling $2 \cdot \omega_H$ for in-phase/quad-phase output generation at $\omega_H$).

FIG. 10 depicts a table 1005 that shows a comparison of the architectures according to some embodiments 1010 with conventional architectures 1011-1016. As shown in FIG. 10, archtectures operating according to some embodiments demonstrate an improved Figure of Merit (FoM) of 0.14 nJ/bit with 1 Mbps data rate, compared with conventional systems. Even though 10 Mbps is not a typical data rate, the architectures according to some embodiments was also simulated with 10 MHz low-frequency input and the same 400 MHz high-frequency signal for up-conversion to assess its high-speed capability.

Figure 11:
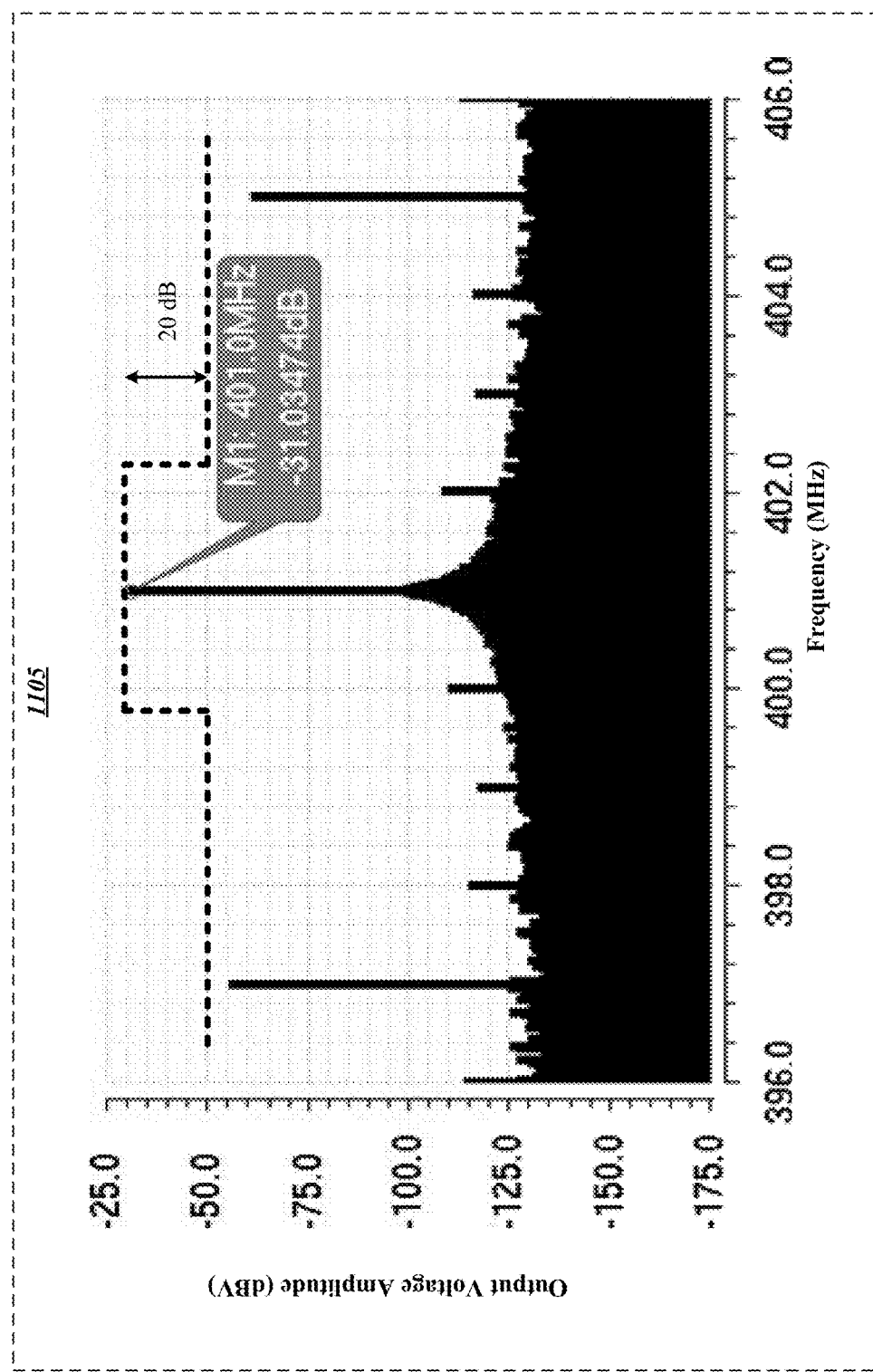
FIG. 11 depicts a graph illustrativing the output voltage spectrum at a power amplifier output for the case of transmitting a "1."
Figure 12:
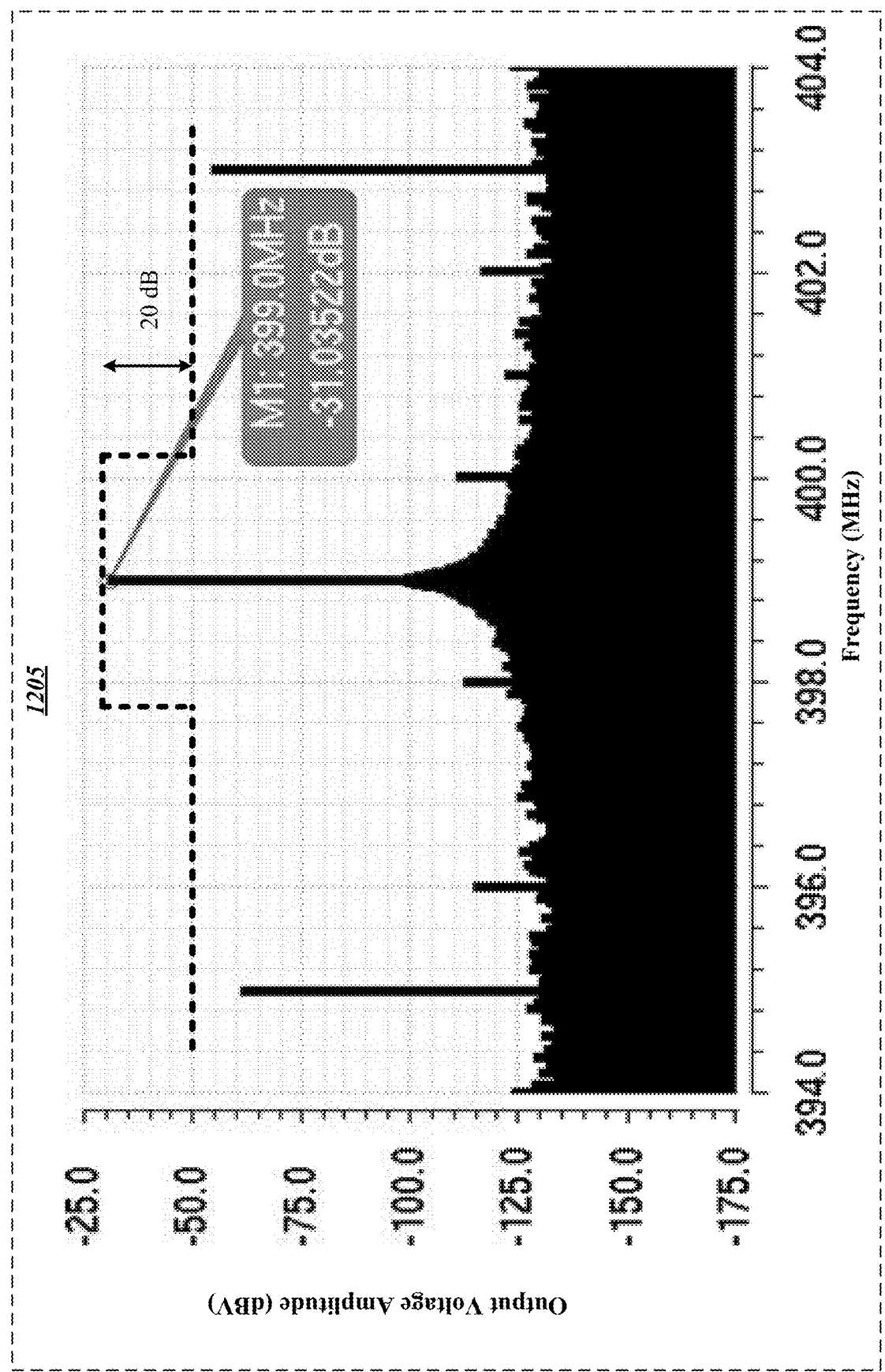
FIG. 12 depicts a graph illustrativing the output voltage spectrum at a power amplifier output for the case of transmitting a "0."
Figure 13:
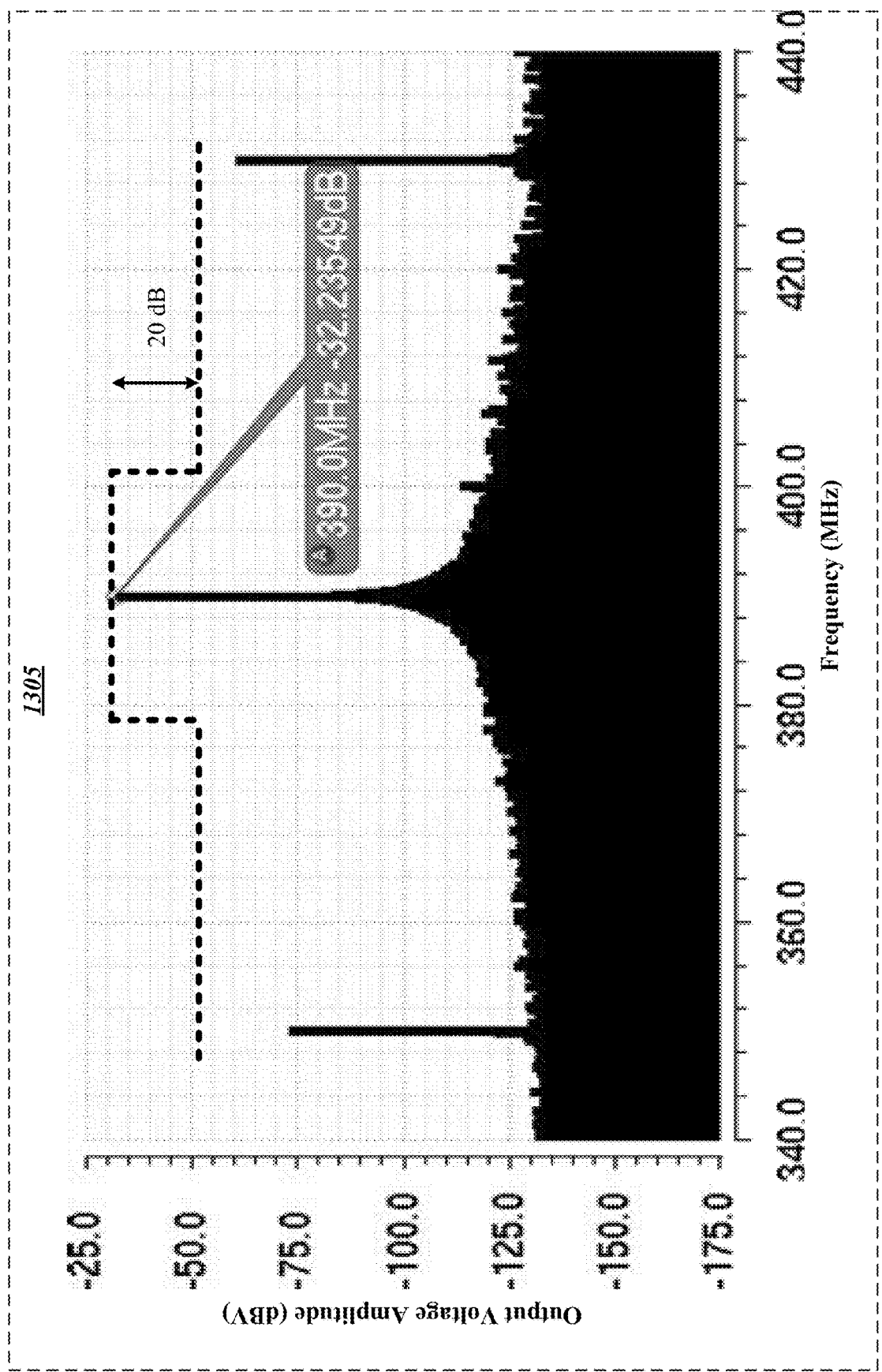
FIG. 13 depicts a graph showing the output spectrum from a simulation with consecutive logic "0" transmissions.

FIG. 11 depicts a graph 1105 illustrativing the output voltage spectrum at the power amplifier output for the case of transmitting a "1" with 1 Mbps. FIG. 12 depicts a graph 1205 illustrativing the output voltage spectrum at the power amplifier output for the case of transmitting a "0" with 1 Mbps. The spectra are compliant with the MICS mask specified by FCC. The total power consumption of the simulated analog circuits is 110 μWatt from a 0.6 Volt supply. An estimated digital power of 30 μW is assumed for the FLL and divider. FIG. 13 depicts a graph 1305 showing the output spectrum from a simulation with consecutive logic "0" transmissions with 10 Mbps; the corresponding FoM is 0.014 nJ/bit.

Numerous specific details have been set forth herein to provide a thorough understanding of the embodiments. It will be understood by those skilled in the art, however, that the embodiments may be practiced without these specific details. In other instances, well-known operations, components, and circuits have not been described in detail so as not to obscure the embodiments. It can be appreciated that the specific structural and functional details disclosed herein may be representative and do not necessarily limit the scope of the embodiments.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A frequency-shift keying (FSK) transmitter to provide transmission of wireless signals, the FSK transmitter comprising:
   a high-frequency generator to generate at least one high-frequency wave signal based on a fixed frequency signal;
   a low-frequency generator to generate at least one low-frequency wave signal based on the fixed frequency signal;
   at least one mixer to mix the at least one high-frequency wave signal and a wave signal based on the at least one low-frequency wave signal together to generate a logic signal, the logic signal representing one of a logic 0 signal or a logic 1 signal based on digital data; and
   at least one multiplexer to receive the digital data and the at least one low-frequency wave signal, the at least one mixer and the high-frequency generator to generate a logic signal based on the digital data.

2. The FSK transmitter of claim 1, the high-frequency generator comprising an all-digital frequency-locked loops (ADFLL).

3. The FSK transmitter of claim 1, the at least one high-frequency wave signal having a frequency of about 401 MHz to about 457 MHz.

4. The FSK transmitter of claim 1, the at least one low-frequency wave signal having a frequency of about 50 KHz to about 10 MHz.

5. The FSK transmitter of claim 1, the at least one high-frequency wave signal comprising at least one in-phase square wave and at least one quad-phase square wave.

6. The FSK transmitter of claim 1, one of the logic 0 signal or the logic 1 signal determined by the following:

$$V_{out} = \sin(\omega_L \cdot t) \times \sin(\omega_H \cdot t) + \cos(\omega_L \cdot t) \times \cos(\omega_H \cdot t),$$

where $V_{out}$ is the output voltage, $\omega_H$ is the at least one high-frequency wave signal, and $\omega_L$ is the low-frequency wave signal.

7. The FSK transmitter of claim 6, an other of the logic 0 signal or the logic 1 signal determined by the following:

$$V_{out} = \sin(\omega_L \cdot t) \times \cos(\omega_H \cdot t) + \cos(\omega_L \cdot t) \times \sin(\omega_H \cdot t),$$

where $V_{out}$ is the output voltage, $\omega_H$ is the at least one high-frequency wave signal, and $\omega_L$ is the low-frequency wave signal.

8. The FSK transmitter of claim 1, the wave signal based on the at least one low-frequency wave signal comprising a signal generated based on the at least one low-frequency wave signal and the digital data.

9. The FSK transmitter of claim 1, comprising at least one multiplexer to:
receive the digital data and the at least one low-frequency wave signal, and
output the wave signal based on the at least one low-frequency wave signal.

10. An apparatus, comprising:
at least one processing circuitry,
at least one memory,
a frequency-shift keying (FSK) transmitter to provide transmission of wireless signals for the apparatus, the FSK transmitter comprising:
a high-frequency generator to generate at least one high-frequency wave signal based on a fixed frequency signal;
a low-frequency generator to generate at least one low-frequency wave signal based on the fixed frequency signal;
at least one mixer to mix the at least one high-frequency wave signal and a wave signal based on the at least one low-frequency wave signal together to generate a logic signal, the logic signal representing one of a logic 0 signal or a logic 1 signal based on digital data; and
at least one multiplexer to receive the digital data and the at least one low-frequency wave signal, the at least one mixer and the high-frequency generator to generate a logic signal based on the digital data.

11. The apparatus of claim 10, the high-frequency generator comprising an all-digital frequency-locked loops (ADFLL).

12. The apparatus of claim 10, the at least one high-frequency wave signal comprising at least one in-phase square wave and at least one quad-phase square wave.

13. The apparatus of claim 10, wherein the apparatus is operative to provide wireless communication in the medical implant communication service (MICS) band.

14. The apparatus of claim 10, the wave signal based on the at least one low-frequency wave signal comprising a signal generated based on the at least one low-frequency wave signal and the digital data.

15. A method to provide transmission of wireless signals via a frequency-shift keying (FSK) transmitter, the method comprising:
generating at least one high-frequency wave signal based on a fixed frequency signal via a high-frequency generator;
generating at least one low-frequency wave signal based on the fixed frequency signal via a low-frequency generator;
mixing the at least one high-frequency wave signal and a wave signal based on the at least one low-frequency wave signal together to generate a logic signal via at least one mixer, the logic signal representing one of a logic 0 signal or a logic 1 signal based on digital data;
receiving the digital data and the at least one low-frequency wave signal via at least one multiplexer; and
generating a logic signal based on the digital data via the at least one mixer and the high-frequency generator.

16. The method of claim 15, one of the logic 0 signal or the logic 1 signal determined by the following:

$$V_{out} = \sin(\omega_L \cdot t) \times \sin(\omega_H \cdot t) + \cos(\omega_L \cdot t) \times \cos(\omega_H \cdot t),$$

where $V_{out}$ is the output voltage, $\omega_H$ is the at least one high-frequency wave signal, and $\omega_L$ is the low-frequency wave signal.

17. The method of claim 15, an other of the logic 0 signal or the logic 1 signal determined by the following:

$$V_{out} = \sin(\omega_L \cdot t) \times \cos(\omega_H \cdot t) + \cos(\omega_L \cdot t) \times \sin(\omega_H \cdot t),$$

where $V_{out}$ is the output voltage, $\omega_H$ is the at least one high-frequency wave signal, and $\omega_L$ is the low-frequency wave signal.

18. The method of claim 15, the wave signal based on the at least one low-frequency wave signal comprising a signal generated based on the at least one low-frequency wave signal and the digital data.

* * * * *